US 6,670,706 B2

(12) United States Patent
Ikegami

(10) Patent No.: US 6,670,706 B2
(45) Date of Patent: *Dec. 30, 2003

(54) SEMICONDUCTOR DEVICE INCLUDING A SEMICONDUCTOR PELLET HAVING BUMP ELECTRODES CONNECTED TO PAD ELECTRODES OF AN INTERCONNECT BOARD AND METHOD FOR MANUFACTURING SAME

(75) Inventor: Gorou Ikegami, Shiga (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/536,148

(22) Filed: Mar. 28, 2000

(65) Prior Publication Data
US 2002/0089057 A1 Jul. 11, 2002

(30) Foreign Application Priority Data
May 31, 1999 (JP) .......................................... 11-151744

(51) Int. Cl.⁷ .............................................. H01L 29/40
(52) U.S. Cl. ........................ 257/734; 257/735; 257/736; 257/739
(58) Field of Search ........................ 257/734, 666–675, 257/733, 735, 736, 739

(56) References Cited

U.S. PATENT DOCUMENTS

| 4,860,087 A | * | 8/1989 | Matsubara | 357/68 |
| 5,394,009 A | * | 2/1995 | Loo | 257/666 |
| 5,585,667 A | * | 12/1996 | Asanasavest | 257/666 |
| 5,719,440 A | * | 2/1998 | Moden | 257/697 |
| 5,900,671 A | * | 5/1999 | Takahashi et al. | 257/287 |
| 6,051,450 A | * | 4/2000 | Ohsawa | 438/123 |
| 6,069,028 A | * | 5/2000 | Stroupe | 438/123 |
| 6,144,091 A | * | 11/2000 | Washida | 257/693 |
| 6,201,304 B1 | * | 3/2001 | Moden | 257/774 |
| 6,236,112 B1 | * | 5/2001 | Horiuchi | 257/734 |
| 6,239,497 B1 | * | 5/2001 | Maruhashi | 257/778 |
| 6,313,999 B1 | * | 11/2001 | Fratti et al. | 174/138 G |

FOREIGN PATENT DOCUMENTS

| JP | 02-3629 | | 1/1990 |
| JP | 03-44051 | | 2/1991 |
| JP | 04-335546 | | 11/1992 |
| JP | 405259430 A | * | 10/1993 |
| JP | 07-169875 | | 7/1995 |

* cited by examiner

Primary Examiner—Olik Chaudhuri
Assistant Examiner—Nathan W. Ha
(74) Attorney, Agent, or Firm—Sughrue Mion, PLLC

(57) ABSTRACT

Parts of pad electrodes formed on an interconnection board so as to correspond to bump electrodes of a semiconductor pellet that neighbor parts superposed with the bump electrodes are caused to extend in substantially the same direction, and ultrasonic vibration is applied in this extension direction so as to make a connection between the pad electrodes and the bump electrodes.

8 Claims, 4 Drawing Sheets

SEMICONDUCTOR DEVICE INCLUDING A SEMICONDUCTOR PELLET HAVING BUMP ELECTRODES CONNECTED TO PAD ELECTRODES OF AN INTERCONNECT BOARD AND METHOD FOR MANUFACTURING SAME

BACKGROUND OF THE INVENTION

1. Field of the Invention

The present invention relates to a semiconductor device in which an electrical connection is made by bringing a semiconductor pellet having a bump electrode and an interconnect board made by forming a pellet electrode on a resilient insulating substrate into mutual opposition, causing the electrodes to be mutually superposed, and imparting ultrasonic vibration to the electrodes, and to a method for manufacturing such a semiconductor device.

2. Background of the Invention

To improve their portability, there is a desire to make compact electronic circuit devices for video cameras, notebook-size personal computers and the like smaller and lighter, and the achievement of smaller electronic components or electronic components of the same dimensions but a higher level of integration used therein contributes to the achievement of more compact and lightweight electronic circuit devices.

The conventional bonding methods used for manufacturing a semiconductor device according to the present invention will be described as follows:

Cited Reference 1-Japanese Utility Model Publication H2-3629

This reference 1 relates to a supersonic type bonding device for electrically connecting an electrode of a semiconductor pellet mounted on a lead frame with a lead of the lead frame with a fine metal wire.

The present reference 1 provides a bonding device for transmitting supersonic vibrations to a wire bonding capillary arranged on the lead frame transporting path through a horn, characterized in that said horn is arranged at an angle of approximately 45° with respect to the lead frame feeding direction on said transporting path.

When the horn is arranged as described above, the horn extends at an angle of approximately 45° with respect to the lead free ends arranged in parallel and perpendicular to the longitudinal direction of the lead frame. At this angle, supersonic vibrations are applied to the lead free ends at the time of wire bonding, and accordingly, it is easy to uniform the wire bonding strength at the lead free ends, whereby the conventional problem is solved.

Cited Reference 2-Japanese Unexamined Patent Application Publication H3-44051 (Kokai)

This reference 2 relates to the art of bonding. In the case of an assembly of a semiconductor device, as one of wire bonding systems, there is a supersonic-combined thermosonic bonding method. Where inner leads of the lead frame are present in four directions, the connecting strength in the inner lead in the direction of supersonic wave is generally large, whereas in the inner lead arranged at right angles to the supersonic direction, the connecting strength is weaker than the former. As described above, all the inner leads are uneven in connecting strength, lacking in stability of connection.

The reference 2 is intended to uniformize connection strength and improve the yield of wire bonding, by positioning all of the inner lead parts and the island part of a lead frame, on the diagonal lines of a frame, and performing wire bonding with ultrasonic wave. For this reason, the constitution of above reference 2 is as follows:

Each inner lead part of a lead frame is arranged along a diagonal line X connecting the points of intersection of an outer frame and an inner frame. The angle between a line Y passing a tab suspension lead and the diagonal line X is 45°. By applying ultrasonic wave via a bonding tool fixed to the tip of an ultrasonic wave transmission arm, wire bonding is performed while a connector wire is sent out. At this time, unidirectional ultrasonic wave is applied in the same direction to all inner lead parts, so that the irregularity of the connection strength between the inner lead parts is hard to generate Hence uniform and stable bonding state between a chip and each inner lead part can be obtained.

Cited reference 3-Japanese Unexamined Patent Application Publication H4-335546 (Kokai)

The reference 3 is related to method and apparatus for single point bonding for TAB(Tape Automated Bonding). This method is intended to obtain a stable bonding strength at leads without irregularity even if the widths of the leads are small. For this reason, the constitution is as follows: A rotating mechanism for relatively moving one or both of a bonding tool and leads to incline a vibrating direction of the tool by an ultrasonic wave at a predetermined angle with respect to a longitudinal direction of the leads, is provided. The tool is inclined at a predetermined angle with respect to the vibrating direction to form a device opening, and a carrier tape in which leads are disposed, is conveyed.

Cited Reference 4-Japanese Unexamined Patent Application Publication H7-169875 (Kokai)

This reference 4 relates to a ball-bonding method. The method is intended to obtain a highly reliable connection whereby a semiconductor element and a board are connected and which has a large connective strength, a high allowable current value and a low connective resistance, by connecting the semiconductor element with the board through the solid phase diffusion performed between a bump formed on the semiconductor element and a wiring formed on the board, while mounting facedown the semiconductor element on the board in a short time and with a high mounting density.

Regarding the constitution thereof, in a semiconductor device wherein a semiconductor element mounted facedown on a glass board configuring a flat display or on a ceramic board configuring a thermal head, the semiconductor element is bonded to the board through a solid phase diffusion performed between a bump formed on the semiconductor element and a wiring formed on the board.

FIG. 10 shows an example of a semiconductor device that enables high-density packaging. In this drawing, the reference numeral 1 denotes a semiconductor pellet and, as shown in FIG. 11, a large number of bump electrodes 3 are formed in a rectangular frame pattern on a main surface of a semiconductor element (not shown in the drawing) therewithin.

The method for forming the bump electrodes 3 is selected from such methods as a method of plating with a metal such as gold, a method of melting a grain of a meltable alloy, and a method of melting a metal wire inserted into capillary so as to form a metal ball, which is pressed at the bottom end of the capillary as ultrasonic vibration is applied to make a connection, after which the metal wire is pulled away.

The reference numeral 4 denotes an interconnection board, formed by a conductive pattern 6 on an insulating substrate 5, as shown in FIG. 12. This conductive pattern 6 is covered by a photoresist film (not shown in the drawing), and windows are formed in the photoresist film so that part of the conductive pattern (rectangular windows shown in the drawing) are exposed at locations corresponding to the bump electrodes 3 of the semiconductor pellet 1, thereby forming the electrode pads 7.

The semiconductor pellet 1 and interconnection board 4 are disposed in mutual opposition to one another, so that the bump electrodes 3 and the pad electrodes 7 are superposed and electrically connected.

In order to relieve the stress concentrated on the electrode connection parts by heat generated when the semiconductor device 8 operates and to improve resistance to humidity, if necessary a resin is filled between the semiconductor pellet 1 and the interconnection board 4.

The method for manufacturing the above-noted semiconductor device 8 is described below. First, the interconnection board 4 is placed on a heated table (not shown in the drawing), with the pad electrodes 7 facing upward.

Next, using a pressing tool into the bottom end of which is built a heater, the semiconductor pellet 1 is vacuum picked, with the bump electrodes facing downward, and moved to the top of the interconnection board 4.

The bump electrodes 3 are superposed on the pad electrodes 7, and the heated top surface of the semiconductor pellet 1 is pressed by the pressing tool, so as to press the electrodes 3 and 7 together, thereby making electrical connections between the semiconductor pellet 1 and the interconnection board 4.

In the foregoing reference 4—Japanese Unexamined Patent Application Publication H7-169875, there is a description of this type of semiconductor device, wherein a ball-bonding method is used with a semiconductor pellet on which are formed metal bump electrodes and an interconnection board made by forming aluminum pad electrodes onto a ceramic substrate, a stage supporting the interconnection board being heated to 375° C. and a head that vacuum holds the semiconductor pellet being heated to 300° C., the electrodes being superposed and pressed with a load of 50 gf per bump for 0.15 second, thereby making a good electrical and mechanical connection between the semiconductor pellet and the interconnection board, achieving a shear strength of 2.7 kgf and an average resistance of 33 mΩ.

There is language in the above-noted disclosure noting that when the above is done, with 146 bump electrodes having flat dimensions of 75×55 μm formed on each pellet, if the joining load is 3 kg or 4 kg and the heated temperature is approximately 380 to 460° C., a shear strength of 1.2 to 5.0 kgf is achieved between the semiconductor pellet and the board.

The above-noted prior art discloses ceramic and also glass as the material of the interconnection board and, in addition to the construction shown in FIG. 10, disclose the ability to apply the technology to a flat display such as a liquid-crystal display device, or to a thermal head.

The semiconductor device having the structure shown in FIG. 10, in addition to ceramic or glass, can be applied to a semiconductor device having a resin substrate such as a fiberglass epoxy resin substrate, although the heating temperature and heating time disclosed in the above-noted prior art cannot be used as is.

That is, with a hard substrate such as ceramic or glass, which is resistant to heat, it is possible to tolerate a temperature of several hundred degrees ° C., enabling heat-caused deformation of the superposed electrode parts to be ignored. With a resin substrate, however, the application of heat causes the interconnection board to soften, so that the superposed electrode parts exhibit a large amount of sinking, resulting in the pad electrode flowing around end part edge of the bump electrode, which increases the contact surface, in addition to a distribution of the load applied to the pellet in the direction of intersection between the sunken curved surface, thereby causing weakening, making it impossible to achieve sufficient joining strength.

When the superposed electrode parts sink, the opposing surfaces of the semiconductor pellet and the interconnection board approach one another and, if these opposing parts come into contact with each other, there is a further weakening of the pressure applied to the superposed electrode parts.

For this reason, when using a resin interconnection board, ultrasonic vibration is applied to the head that vacuum holds and presses the semiconductor pellet, so that the temperature of the substrate is sufficiently lowered in comparison with the temperature disclosed in the prior art, thereby suppressing deformation of the substrate, the bump electrode and the pad electrode superposed parts being subjected to pressure and heating as ultrasonic vibration is imparted thereto to connect the two together.

By doing the above, it is possible, for a semiconductor device having approximately 10 electrodes, to achieve a semiconductor device with good shear strength and electrical resistance.

To achieve a semiconductor device with a large number of electrodes while maintaining the outer dimensions, it is necessary to make the bump electrodes on the semiconductor pellet side narrow, and to make the spacing of the conductive pattern on the interconnection board side narrow. If batch ultrasonic connection is made with a multi-electrode semiconductor pellet in which the number of electrodes greatly exceeds 10 and a semiconductor pellet in which the number of electrodes is fewer than 10, it is seen that there is a great dependency on the number of electrodes of the shear strength per electrode between the bump electrodes and the pad electrodes, although the variation in electrical resistance between the bump electrodes and pad electrodes is large in a semiconductor device having a large number of electrodes.

SUMMARY OF THE INVENTION

Accordingly, it is an object of the present invention to solve the above-noted problems associated with the prior art, by providing a semiconductor device in which ultrasonic vibration is used to make electrical connection between bump electrodes formed on a semiconductor pellet and pad electrodes formed on an insulating substrate. This semiconductor device has bump electrodes on the above-noted semiconductor pellet which are arranged in at least two straight lines that mutually intersect at right angles, a neighboring region of pad electrodes formed on a resilient interconnection board and including a part superposed with the bump electrodes extending in a direction that is different from the arrangement direction of the bump electrodes.

The present invention is also a method for manufacturing a semiconductor device having a semiconductor pellet having bump electrodes on a main surface arranged in at least two straight lines that are mutually perpendicular and a resilient interconnection board on which are formed pad electrodes at locations corresponding to the bump electrodes on an insulating substrate, the bump electrodes and pad electrodes being superposed and parallelness being maintained between the semiconductor pellet and the interconnection board as pressure is applied from above the semiconductor pellet while ultrasonic vibration is applied, thereby making an electrical connection between the semiconductor pellet and the bump electrodes. An interconnection board having region of pad electrodes neighboring the superposed part of the bump electrodes extends in a direction that is different from the arrangement direction of the bump electrodes is used, the direction of ultrasonic vibration imparted to the superposed part of the bump electrodes and the pad electrodes via the semiconductor pellet being set so as to follow the direction of extension of the pad electrodes.

A semiconductor device according to the present invention is a semiconductor device in which bump electrodes on a semiconductor pellet and pad electrodes on an insulating substrate are caused to be superposed, and ultrasonic vibration is applied thereto to make an electrical connection. The bump electrodes are arranged in at least two perpendicularly intersecting straight lines of a large number of bump electrodes, and a neighboring region including the part superposed with the bump electrodes is extend in a direction that is different from the arrangement direction of the bump electrodes, an the above-noted neighboring region of the pad electrodes intersects with the bump electrode arrangement direction so as to form therewith an angle in the range 30° to 60°.

In the above case, it is desirable that all the pad electrodes on the interconnection board be arranged in a direction that is the same as the extension direction of the neighboring region including the part superposed with the bump electrodes.

The length of a region that neighbors the part of the pad electrodes and bump electrodes that is superposed can be established as longer than the length of the superposed part.

In the above case, it is desirable that the region neighboring with the superposed region of the pad electrodes and the bump electrodes caused to extend to a region of the insulating substrate that does not deform by the application of pressure.

In a method for manufacturing a semiconductor device according to the present invention, a interconnection board is used in which a neighboring region including a superposed part between pad electrodes and bump electrodes is caused to extend in a direction that is different from the arrangement direction of the bump electrodes, the direction of ultrasonic vibration applied to the superposed part of the bump electrodes and pad electrodes via a semiconductor pellet being established along the extension direction of the pad electrodes, and it is possible to established the vibration direction of the ultrasonic vibration to an intermediate angle intersection angle between bump each of at least two lines of bump electrodes arranged in at least two straight lines and the pad electrodes.

DESCRIPTION OF THE PREFERRED EMBODIMENTS

Embodiments of the present invention are described in detail below, with reference made to relevant accompanying drawings.

Figure 1:
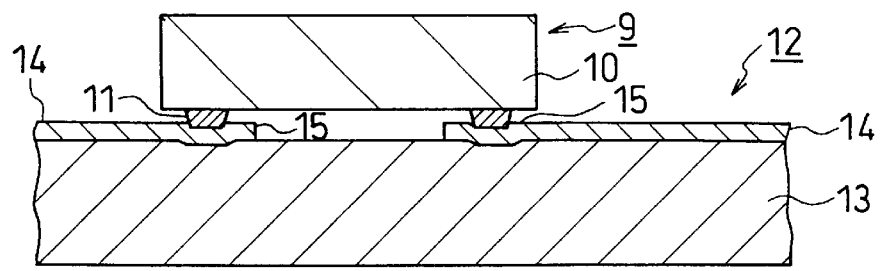
FIG. 1 is a side cross-section view showing a semiconductor device according to the present invention.

The first embodiment of the present invention will be described with reference to FIG. 1. In this drawing, the reference numeral 9 denotes a semiconductor pellet, on a main surface of semiconductor substrate 10 of which, measuring 3.4×5.1 (shape)×0.3 (thick) mm and having semiconductor elements (not shown in the drawing) formed on it, are arranged a large number of bump electrodes 11.

Figure 2:
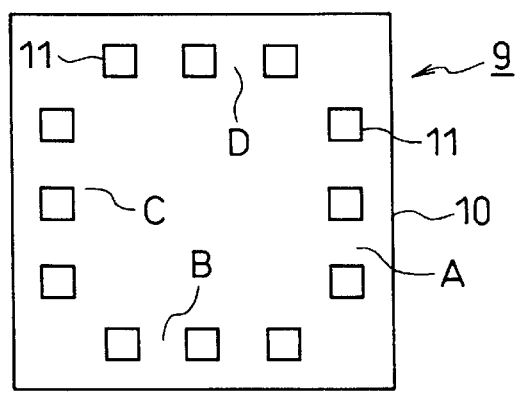
FIG. 2 is a plan view of a semiconductor pellet used in the semiconductor of FIG. 1.

The bump electrodes 11 are formed, as shown in FIG. 2, in straight lines around the sides of a square or rectangular semiconductor substrate 10 in groups of electrodes A, B, C, and D, by the method of forming windows in certain parts of a protective film (not shown in the drawing) covering the semiconductor substrate 10 and plating over a barrier film (not shown in the drawing) or by the ball bonding method, the extension parts of the parallel electrode arrangement groups A & C or B & D being perpendicularly intersecting with neighboring electrode arrangement groups.

While in the example shown in the drawing, the bump electrodes 11 of each of the electrode arrangement groups A, B, C, and D are arranged in a single circular arrangement, in order to form a larger number of electrodes, it is also possible to arrange them in staggered lines.

The reference numeral 12 denotes an interconnection board, which is made by forming a conductive pattern 14 onto a resilient resin substrate 13, such as one made of fiberglass reinforced epoxy, with pad electrodes 15 being formed on the conductive pattern 14 at locations corresponding to the bump electrodes 11 of the semiconductor pellet 9.

These pad electrodes 15 are provided so as to suit the electrode material, shape, and dimensions of the bump electrodes 11. For example, for bump electrodes 11 that measure 80 $\mu$m on a side and are 25 $\mu$m high, on semiconductor pellet 9 formed using gold plating, on which a copper foil of thickness 12 $\mu$m is etched so as to form a conductive pattern 14, a nickel layer having a thickness of 3 to 5 $\mu$m is formed on locations intended for use as pad electrodes 15, these being covered to a thickness of 0.3 $\mu$m with gold to form the pad electrodes 15 on the interconnection board 12.

Figure 3:
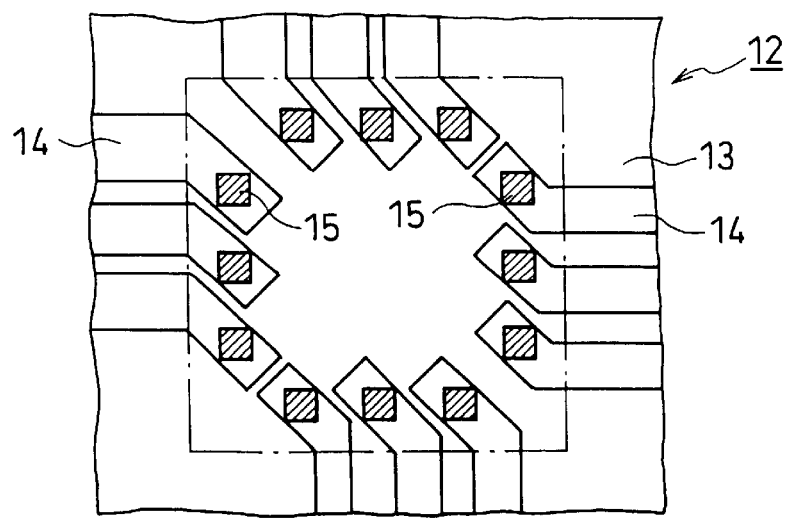
FIG. 3 is a partial plan view of an interconnection board used in the semiconductor device of FIG. 1.

When the above is done, the pad electrodes 15, as shown in FIG. 3, are in opposition with bump electrodes 11 of the semiconductor pellet 9 indicated by the broken line. Neighboring areas that include the part that is superposed with the bump electrodes 11 (hatched area in the drawing) intersect with the arrangement directions of the electrode arrangement groups A, B, C, and D at an angle of 45°, and extend in one and the same direction.

Figure 4:
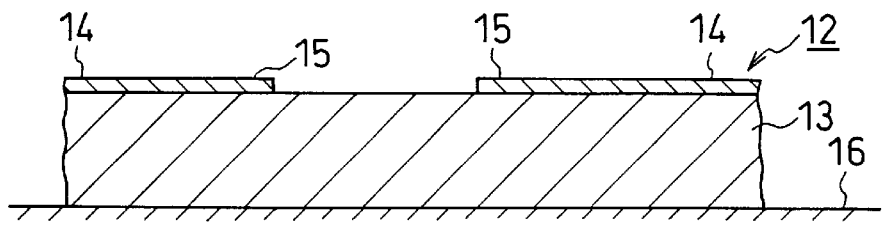
FIG. 4 is a side cross-section view showing a method for manufacturing the semiconductor device of FIG. 1.

A method for manufacturing a semiconductor device according to the present invention is as follows. First, an interconnection board 12 such as shown in FIG. 3 is placed on a heating table 16 such as shown in FIG. 4, positioned, and heated. In order to achieve a good ultrasonic connection between the bump electrodes 11 and the pad electrodes 15, this interconnection board 12 is heated. In the case of a fiberglass epoxy board, which exhibits softening in the presence of heated, the heating temperature is set to 80° C.

Figure 5:
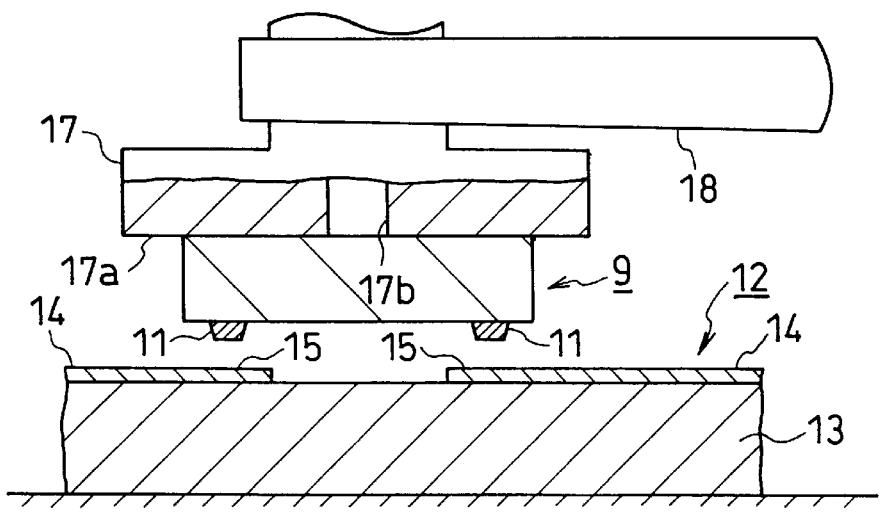
FIG. 5 is a side cross-section view showing the processes subsequent to those of FIG. 4.

Next, a vacuum holding head 17 such as shown in FIG. 5 is used to vacuum pick the semiconductor pellet 9, and place it on the interconnection board 12. The vacuum holding head 17 has a vacuum port 17b on a flat lower end surface 17a, and is linked to a horn which applies ultrasonic vibration, the horn moving both horizontally and up and down, so as to impart ultrasonic vibration to the semiconductor pellet 9 on the interconnection board 12.

Figure 6:
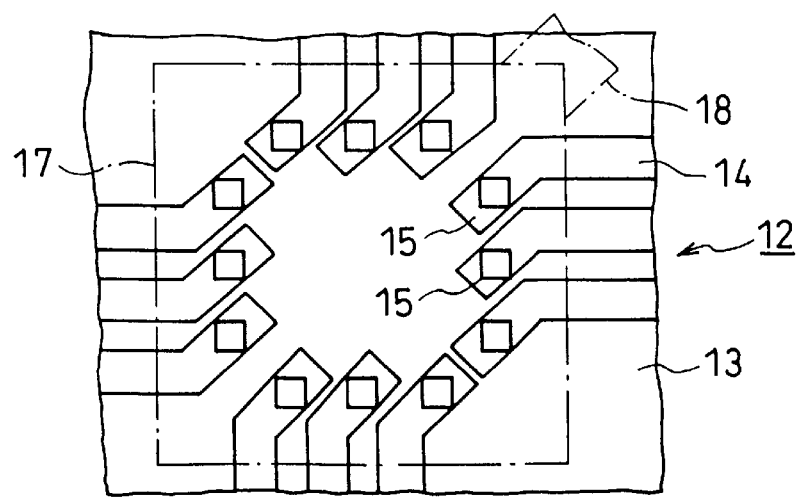
FIG. 6 is a partial plan view showing the interconnection board and the direction of ultrasonic vibration in the process of FIG. 5.

The horn linked to the above-noted vacuum holding head 17 is arranged as shown in FIG. 6, this being the ultrasonic vibration direction, substantially coincides with the extension direction of the pad electrodes 15.

Next, the vacuum holding head 17 is lowered over the interconnection board 12, the bump electrodes 11 and the pad electrodes 15 being superposed, and a pressure of 30 gf per bump electrode is applied for 0.3 to 3 seconds to the semiconductor pellet 9. Because the interconnection board 12 is heated and softened, the pad electrodes 15 are locally pressed and form a concave curvature.

When this occurs, the pad electrodes 15 corresponding to all the bump electrodes 11 extend in the same direction, which is the direction of the ultrasonic vibration.

Figure 7:
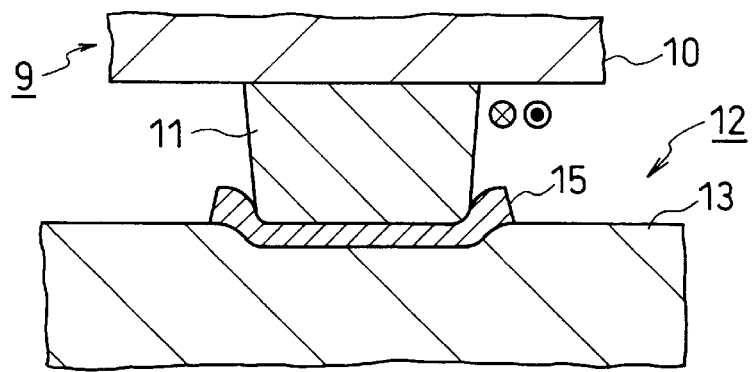
FIG. 7 is a partial cross-section view showing the condition of ultrasonic vibration applied to the superposed electrode part.

That is, because the ultrasonic vibration applied to the bump electrodes 11 is applied in the extension direction of the pad electrodes 15, the ultrasonic vibration applied in a direction that is perpendicular with respect to the drawing plane of FIG. 7 is not applied to the pad electrodes 15 in the width direction.

For this reason, there is no external force that causes torsional deformation of the pad electrodes 15 in the width direction in which the adhered length with respect to the insulating substrate 13 of the pad electrode 15 is short.

Because regions neighboring the pad electrodes 15, as

Figure 8:
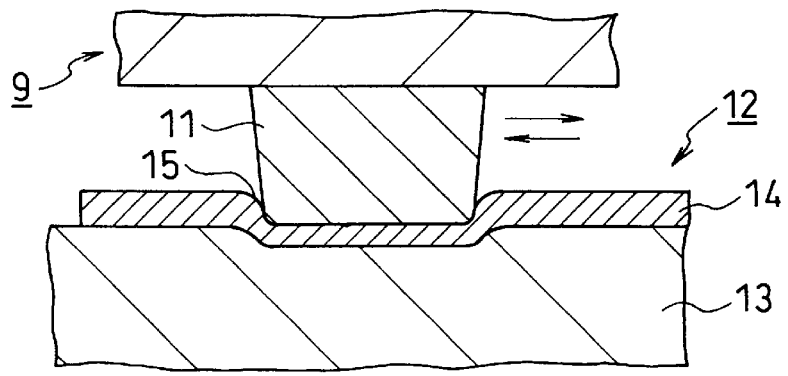
FIG. 8 is a partial cross-section view showing the condition of ultrasonic vibration applied to the superposed electrode part.

Because regions neighboring the pad electrodes 15, as shown in FIG. 8, extend to a region that is not deformed by the application of pressure to the superposed parts, the adhered length with respect to the insulating substrate 13 is sufficiently long, and even if interconnection board 12 softens by heating so that the electrode superposed parts sinks, ultrasonic vibration applied in a direction parallel to the drawing plane, this being in the extension direction of the pad electrodes 15, is concentrated on the electrode superposed part, enabling a good electrical connection.

Because all of the pad electrodes 15 in a semiconductor device according to the present invention are caused to extend in the same direction, not only can the joining strength between electrodes be made large and the electrical resistance be made small, there variations thereof can be made small, so that even without using a hard material such as a ceramic substrate or a glass substrate, it is possible even when the number of bump electrodes greatly exceeds 10, for example, in the case of a 100-electrode semiconductor pellet, to achieve a shear strength of 30 gf or greater for each bump electrode, and a low resistance connection of approximately 50 mΩ.

Upon shearing the semiconductor pellet 9 from the interconnection board 12 and observing the connection condition in the superposed part, it was verified that part of a bump electrode 11 remained on all the pad electrodes 15, thereby indicating a strong and uniform mechanical connection.

Figure 9:
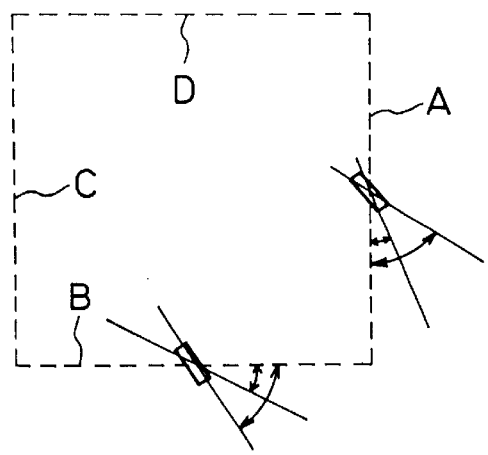
FIG. 9 is a partial plan view showing the angle made between the electrode arrangement group and the pad electrodes.
Figure 10:
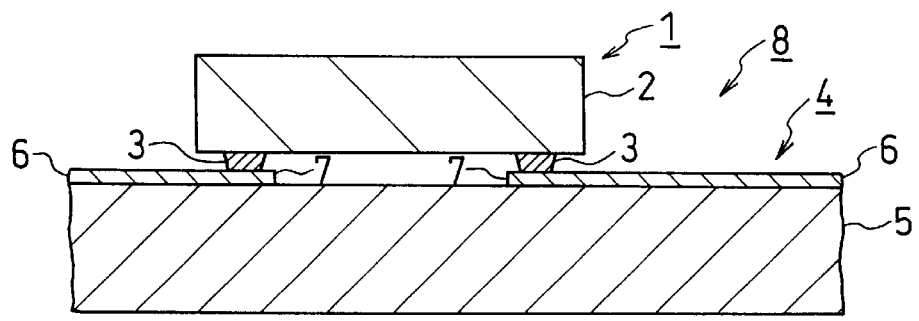
FIG. 10 is a side cross-section view showing an example of a semiconductor device.
Figure 11:
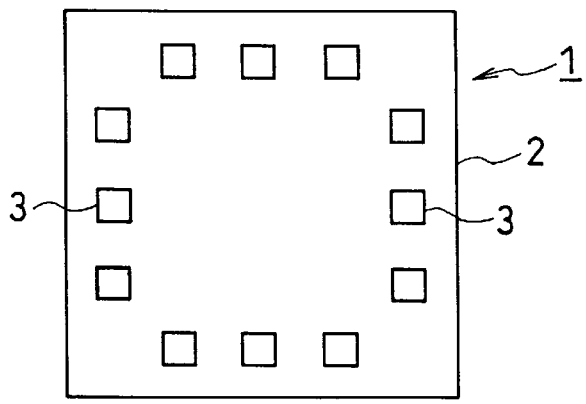
FIG. 11 is a plan view of a semiconductor pellet used in the semiconductor of FIG. 10.
Figure 12:
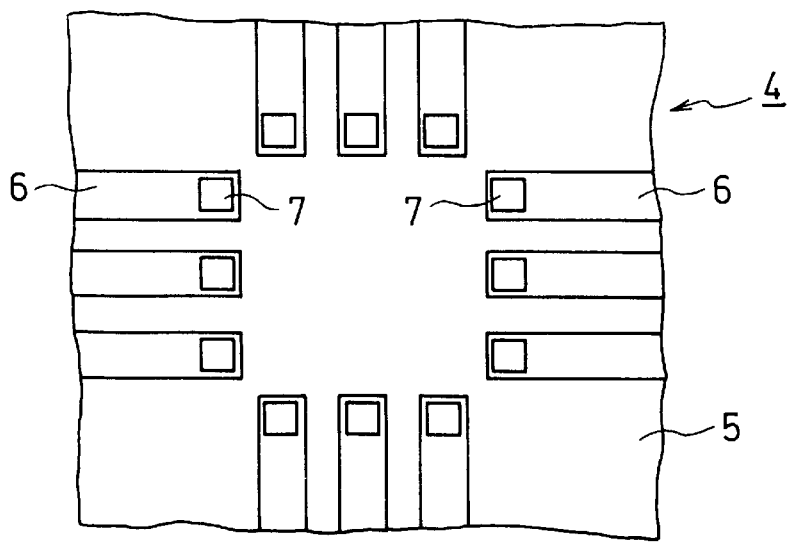
FIG. 12 is a partial plan view showing an example of an interconnection board used in the semiconductor device of FIG. 10.

While in the example described above, the pad electrodes 15 were caused to extend at an angle of 45° with respect to the arrangement direction of the electrode arrangement groups A, B, C, and D, as long as the inclination angle, as shown in FIG. 9, is in the range from 30° to 60°, it is possible to achieve a good connection, with suppression of a lowering of the shear strength and an increase in electrical resistance.

In this case, it is desirable that the direction of the ultrasonic vibration be made in an intermediate direction of the inclination direction, for example, if the maximum inclination angle is between 30° and 60°, the direction of the ultrasonic vibration can be made 45° with respect to the electrode arrangement groups A, B, C, and D.

While it is desirable that the extension direction of all the pad electrodes 15 be the same, for pads such as those at the corners of the pellet, at which it is possible to achieve sufficient surface area in the superposed part, it is acceptable to have the extension direction be different from the other bump electrodes.

It is possible by setting the length of the region neighboring a superposed part between the pad electrodes 15 and the bump electrodes 11 longer than the electrode superposed part, to make the concave curvature caused by pressure applied to the pad electrodes 15 and the neighboring insulating substrate 13 long, and it is desirable to cause extension to a region which does not exhibit deformation due to application of pressure.

It will be understood that the present invention is not restricted by the foregoing embodiments. For example, in addition to square bump electrodes 11, it is possible to use bump electrodes that are rectangular, diamond-shaped, or parallelogram-shaped, and it is further possible to change the width and extension direction of the pad electrodes 15 to suit the inclination angle.

By adopting the constitution described in detail above, even if a resin interconnection board is used which softens when heated, the present invention enables a strong electrical and mechanical connection to a semiconductor pellet having more than 10 electrodes.

What is claimed is:

1. A semiconductor device comprising:
   a semiconductor pellet including a plurality of bump electrodes;
   an interconnection board including an insulating substrate and a plurality of pad electrodes formed on said insulating substrate at positions corresponding to said bump electrodes,
   wherein said bump electrodes and pad electrodes are superposed so that said semiconductor pellet and interconnection board are in opposition to one another and electrically connected together, and
   wherein said bump electrodes on said semiconductor pellet are arranged in at least two groups forming straight lines that perpendicularly intersect, the insulating substrate forming said interconnection board being a material with resilience, said pad electrodes comprise superposition regions where said pad electrodes and said bump electrodes are superposed and neighboring regions surrounding said superposition regions, and all of said neighboring regions extend in the same direction which is different from the arrangement directions of the bump electrodes.

2. A semiconductor device according to claim 1, wherein said neighboring regions of said pad electrodes intersect at an inclination angle from 30° to 60° with respect to the arrangement direction of the bump electrodes.

3. A semiconductor device according to claim 2, wherein each of the superposition regions includes a deformed concave region where said pad electrodes and said bump electrodes are superposed.

4. A semiconductor device according to claim 1, wherein a length of a region neighboring each of said superposition regions where said pad electrodes and said bump electrodes are superposed is longer than a length of said superposition regions.

5. A semiconductor device according to claim 4, wherein a region neighboring each of said superposition regions where said pad electrodes and said bump electrodes are superposed extends as far as a region that is beyond said deformed concave surface where said pad electrodes and said bump electrodes are superposed.

6. A method for manufacturing a semiconductor device comprising a semiconductor pellet including a plurality of bump electrodes on a main surface arranged in at least two groups forming straight lines that are mutually perpendicular and a resilient interconnection board including a plurality of pad electrodes at locations corresponding to said bump electrodes on an insulating substrate, the method comprising pressing together said semiconductor pellet and said interconnection board so that said bump electrodes and said pad electrodes are superposed and parallelness maintained between said semiconductor pellet and said interconnection board while applying ultrasonic vibration to bump electrodes via said semiconductor pellet to make an electrical connection between said bump electrodes and said pad electrodes, wherein said pad electrodes include superposition regions where said pad electrodes and said bump electrodes are superposed and neighboring regions surrounding said superposition regions which extend in the same direction that is different from the arrangement directions of neighboring regions of said bump electrodes, and a direction of said ultrasonic vibration applied to said bump electrodes via said semiconductor pellet is the same as the direction of extension of neighboring regions of said pad electrodes.

7. A method for manufacturing a semiconductor device according to claim 6, wherein the direction of ultrasonic vibration is set at an intermediate angle direction of an intersection angle between arrangement directions of said groups of said bump electrodes along at least two straight lines that intersect one another and said pad electrodes.

8. A semiconductor device comprising:
   a semiconductor pellet including a plurality of bump electrodes;
   an interconnection board including an insulating substrate and a plurality of pad electrodes formed on said insulating substrate at positions corresponding to said bump electrodes;
   wherein said semiconductor pellet and said interconnection board are disposed in opposition to one another, said bump electrodes and pad electrodes are superposed, and said semiconductor pellet and said interconnection board are subjected to pressure and ultrasonic vibration, thereby electrically connecting said semiconductor pellet to said interconnection board, and
   wherein said bump electrodes on said semiconductor pellet are arranged in at least two straight lines that perpendicularly intersect, the insulating substrate forming said interconnection board being a material with resilience, and a neighboring region including a superposition part between the pad electrode and the bump electrode, said neighboring region being extended in a direction different from the arrangement directions of the bump electrodes and in a direction that is substantially the same direction of said ultrasonic vibration.

* * * * *